(12) United States Patent
Pettus et al.

(10) Patent No.: US 7,768,457 B2
(45) Date of Patent: Aug. 3, 2010

(54) INTEGRATED ANTENNA AND CHIP PACKAGE AND METHOD OF MANUFACTURING THEREOF

(75) Inventors: Michael Gregory Pettus, Dana Point, CA (US); James Robert Amos Bardeen, Los Angeles, CA (US)

(73) Assignee: Vubiq, Inc., Aliso Viejo, CA (US)

( * ) Notice: Subject to any disclaimer, the term of this patent is extended or adjusted under 35 U.S.C. 154(b) by 0 days.

(21) Appl. No.: 12/070,281

(22) Filed: Feb. 15, 2008

(65) Prior Publication Data
US 2009/0207090 A1 Aug. 20, 2009

Related U.S. Application Data

(60) Provisional application No. 60/936,951, filed on Jun. 22, 2007.

(51) Int. Cl.
*H01Q 1/38* (2006.01)
(52) U.S. Cl. .............................. 343/700 MS; 343/702; 343/872; 343/753; 343/909
(58) Field of Classification Search .......... 343/700 MS, 343/872, 909
See application file for complete search history.

(56) References Cited

U.S. PATENT DOCUMENTS

| | | | |
|---|---|---|---|
| 5,276,345 | A | 1/1994 | Siegel et al. |
| 5,754,948 | A | 5/1998 | Metze |
| 5,903,239 | A | 5/1999 | Takahashi et al. |
| 6,236,366 | B1 | 5/2001 | Yamamoto et al. |
| 6,313,801 | B1 | 11/2001 | Sanford et al. |
| 7,084,815 | B2 | 8/2006 | Phillips et al. |
| 7,295,161 | B2 * | 11/2007 | Gaucher et al. ....... 343/700 MS |
| 7,372,408 | B2 * | 5/2008 | Gaucher et al. ....... 343/700 MS |

(Continued)

FOREIGN PATENT DOCUMENTS

DE 198 59 002 6/2000

(Continued)

OTHER PUBLICATIONS

International Search Report and Written Opinion for International Application No. PCT/US2008/007804 mailed Jan. 29, 2009.

(Continued)

*Primary Examiner*—Hoang V Nguyen
(74) *Attorney, Agent, or Firm*—Nixon Peabody LLP; David B. Ritchie

(57) ABSTRACT

An integrated antenna and chip package and method of manufacturing thereof. The package includes a first substrate having a first surface and a second surface, The second surface is configured to interface the chip package to a circuit board. A second substrate of the package is disposed on the first surface of the first substrate and is made of a dielectric material. One or more antennas are disposed on the second substrate and a communication device is coupled to the antenna, wherein the communication device is disposed on the second substrate in substantially the same plane as the antenna. A lid is coupled to the first substrate and is configured to encapsulate the antenna and the communication device. The lid has a lens that is configured to allow radiation from the antenna to be emitted therethrough and a shoulder configured to transfer heat produced from the communication device.

13 Claims, 12 Drawing Sheets

U.S. PATENT DOCUMENTS

| | | | |
|---|---|---|---|
| 2001/0050927 | A1 | 12/2001 | Johnson |
| 2002/0158770 | A1 | 10/2002 | Ahmed et al. |
| 2004/0199559 | A1 | 10/2004 | McAdam et al. |
| 2005/0198406 | A1 | 9/2005 | Sichner |
| 2006/0234787 | A1 | 10/2006 | Lee et al. |
| 2007/0103380 | A1* | 5/2007 | Weste ............... 343/907 |
| 2007/0112982 | A1 | 5/2007 | Sichner et al. |

FOREIGN PATENT DOCUMENTS

| | | |
|---|---|---|
| DE | 10 2004 045 707 | 3/2006 |
| EP | 0 766 410 | 4/1997 |
| EP | 0 884 799 | 12/1998 |
| EP | 1 357 395 | 10/2003 |
| WO | 2006/102749 | 10/2006 |

OTHER PUBLICATIONS

International Search Report and Written Opinion for International Application No. PCT/US2008/007780 mailed Jan. 30, 2009.

Abele, P. et al., "Wafer Level Integration of a 24 GHz Differential SiGe-MMIC Oscillator with a Patch Antenna using BCB as a Dielectric Layer", pp. 419-422, 11th GAAS Symposium—Munich 2003.

Agarwal, B. et al., "A Transferred-Substrate HBT Wide-Band Differential Amplifier to 50 GHz", pp. 263-265, IEEE Microwave and Guided Wave Letters, vol. 8, No. 7, Jul. 1998.

Aoki S. et al., "A Flip Chip Bonding Technology Using Gold Pillars For Millimeter-Wave Applications", pp. 731-734, 1997 IEEE MTT-S Digest.

Bodo, Peter, "Low Cost Interconnect, Packaging and Sub-system Integration Technologies for Millimetrere-wave Applications", Information Society Technologies, Project No. 30128, Mar. 9, 2005.

Boustedt, Katarina, "GHz Flip Chip—An Overview", 1998 48th Electronic Components and Technology Conference, pp. 297-302, May 1998.

Brauner, T., "A Differential Active Patch Antenna Element for Array Applications", pp. 161-163, IEEE Microwave and Wireless Components Letters, vol. 13, No. 4, Apr. 2003.

Deal, William R. et al.,"Integrated-Antenna Push-Pull Power Amplifiers", pp. 1418-1425, IEEE Transactions on Microwave Theory and Techniques, vol. 47, No. 8, Aug. 1999.

Gilleo, Dr. Ken, Chip Scale or Flip Scale—the Wrong Question?, pp.1-8, date: at least as early as Jun. 21, 2007.

Hang, Cynthia Y. et al., "High-Efficiency Push-Pull Power Amplifier Integrated with Quasi-Yagi Antenna", pp. 1155-1161,IEEE Transactions on Microwave Theory and Techniques, vol. 49, No. 6, Jun. 2001.

Jentzsch, Andrea et al. "Theory and Measurements of Flip-Chip Interconnects for Frequencies up to 100 GHz", pp. 871-878, IEEE Transactions on Microwave Theory and Techniques, vol. 49, No. 5, May 2001.

Karnfelt, C. et al., "Flip Chip Assembly of a 40-60 GHz GaAs Microstrip Amplifier", pp. 487-490, 12th GAAS Symposium-Amsterdam, 2004.

Pfeiffer, U. et al., "A 60GHz Radio Chipset Fully-Integrated in a LowCost Packaging Technology", pp. 1343-1346, 2006 Electronic Components and Technology Conference.

Pfeiffer, Ullrich et al., "A Chip-Scale Packaging Technology for 60-GHz Wireless Chipsets", pp. 3387-3397, IEEE Transactions on Microwave Theory and Techniques, vol. 54, No. 8, Aug. 2006.

Pfeiffer, Ullrich et al., "Equivalent Circuit Model Extraction of Flip-Chip Ball Interconnects Based on Direct Probing Techniques", pp. 594-596, IEEE Microwave and Wireless Components Letters, vol. 15, No. 9, Sep. 2005.

Pfeiffer, Ullrich R., "Low-loss Contact Pad with Tuned Impedance for Operation at Millimeter Wave Frequencies" pp. 61-64, Proceedings of 9th IEEE Workshop on Signal Propagation on Interconnects, May 2005.

Schrank, Hal et al. "Analysis of the Radiation Resistance and Gain of a Full-Wave Dipole", 45-47, IEEE Antennas and Propagation Magazine, vol. 36, No. 5, Oct. 1994.

Staiculescu, Daniela et al., "Flip-Chip vs. Wirebond, There's no clear winner yet in the microwave and millimeter-wave arenas", p. 12-16, Printed Circuit Design, Jun. 2002.

Viallon, Christophe et al., Microwave differential structures optimization: application to a double balanced SiGe active down-converter design, pp. 91-94, IEEE International Workshop on Radio-Frequency Integration Technology, Nov. 30,-Dec. 2, 2005, Singapore.

* cited by examiner

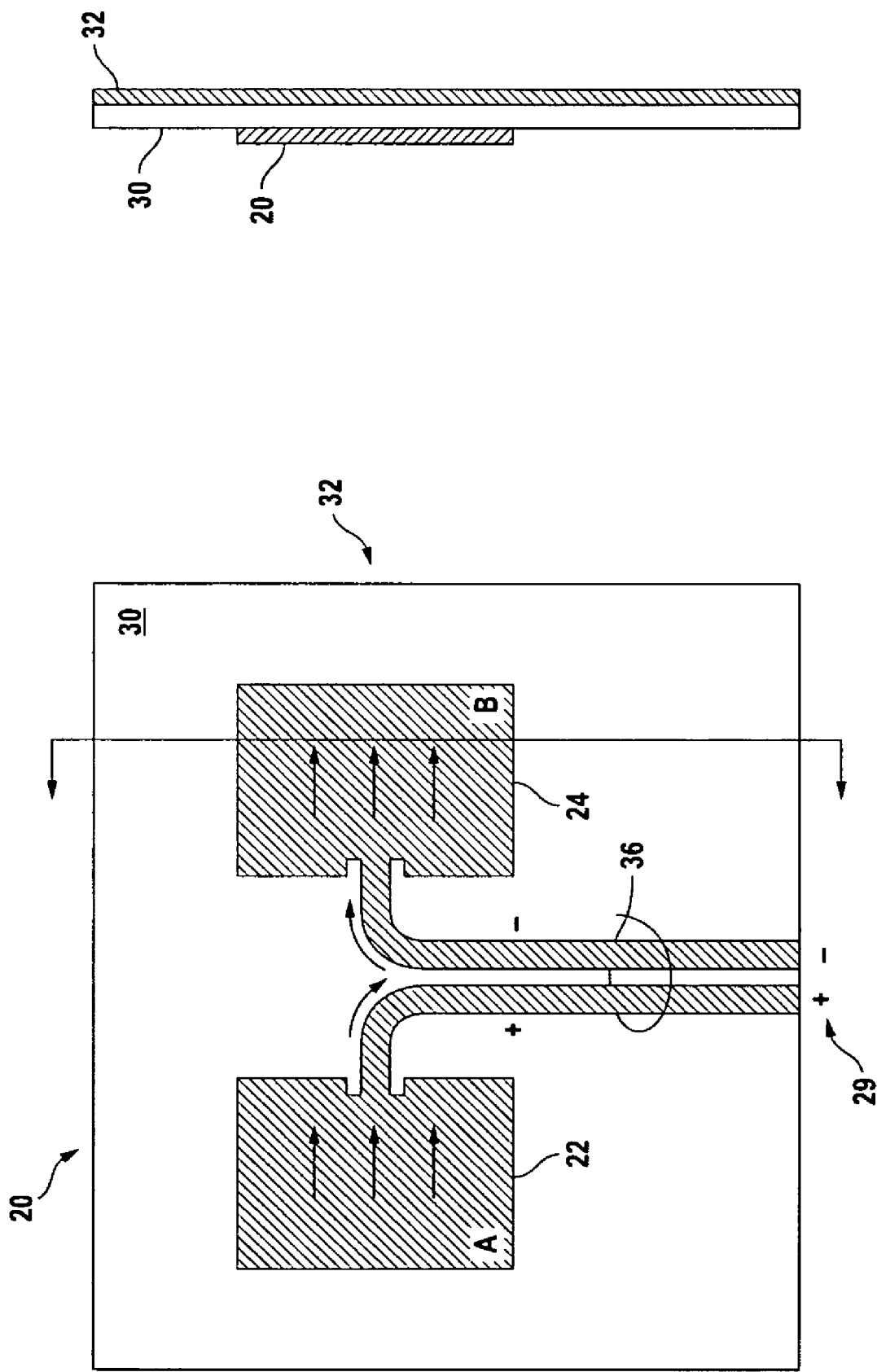

INTEGRATED ANTENNA AND CHIP PACKAGE AND METHOD OF MANUFACTURING THEREOF

STATEMENT OF RELATED APPLICATION

The present application claims the benefit of priority based on United States Provisional Patent Application Ser. No. 60/936,951, filed on Jun. 22, 2007, in the name of inventor Michael G. Pettus, entitled "System and Method for Wireless Communication in a Backplane Fabric Architecture," which is hereby incorporated by reference.

TECHNICAL FIELD

The subject matter described herein relates generally to an integrated antenna and chip package and a method of manufacturing thereof.

BACKGROUND

Over the years wireless systems have significantly increased in number and applications. Voice and data transmission lead the current usage of wireless devices. New applications are creating more wireless demand, and higher bandwidth requirements are putting pressure on the currently used wireless systems and radio spectrum allocations. Data rates are approaching and will be exceeding the 1 gigabit per second (1 Gb/s) speed point. Gigabit LAN and high definition digital television are examples of applications that will demand very high bandwidth wireless solutions.

By making use of higher frequency radio waves, it becomes practical to create wireless systems with higher operating bandwidths. As an example, the unlicensed wireless LAN spectrum allocated in the U.S. in the 2.4 GHz band extends from 2.4000 to 2.4835 GHz, resulting in an operating maximum bandwidth of 83.5 MHz. The U.S. 60 GHz unlicensed spectrum extends from 57 GHz to 64 GHz, resulting in a maximum bandwidth of 7 GHz (greater than 80 times the bandwidth at 2.4 GHz). Hence the ability to solve greater bandwidth demand is found by exploiting the millimeter wave frequency bands—generally considered those frequencies above 30 GHz.

Designing circuitry for millimeter wave transmitters and receivers requires scaling down the physical size of the electrical interconnect techniques that work fine at the lower frequencies but degrade as the operating frequency increases (and wavelength decreases). The most cost effective technology for integrating transmitter and receiver circuitry is the integrated circuit (IC) based on a semiconductor process. Current semiconductor process technologies have now enabled the ability to create ICs that operate in the millimeter wave regions up through 100 GHz.

Since the physical size of electrical interconnects inside of an IC are extremely small (on the order of $10^{-6}$ meters, or microns), it is feasible for the IC to operate at frequencies in the 30 to 100 GHz range (with wavelengths on the order of $10^{-3}$ meters, or millimeters). The problem that immediately presents itself is how to get the millimeter wave energy to and from the IC without appreciable attenuation and loss. The standard method for interconnecting an IC to its outside environment is wire bonding. Small wires are bonded to terminal pads on the IC with the other end of the wires bonded to a pad within the IC package, which in turn are connected to the outside pin on the package typically through a printed circuit trace. The electrical properties of the wire bond, pads and the printed circuit trace (inherent inductance and capacitance) creates appreciable attenuation and unwanted radiation (all adding up to unacceptable losses) at millimeter wave frequencies.

What is needed is a system and method to interconnect a millimeter wave antenna to the integrated circuit without incurring losses through legacy low frequency connections in an efficient and inexpensive integrated antenna and chip package.

OVERVIEW

In an aspect, a chip package comprises a first substrate having a first surface and a second surface, the second surface configured to interface the chip package to a circuit board; a second substrate disposed on the first surface of the first substrate, the second substrate being made of a dielectric material; an antenna disposed on the second substrate; a communication device coupled to the antenna, wherein the communication device is disposed on the second substrate; a lid coupled to the first substrate and configured to encapsulate the antenna and the communication device, the lid having a lens configured to allow radiation from the antenna to be emitted therethrough.

In another aspect, an antenna package lid comprising a thermally conductive body having a top surface, a bottom surface, and four sides disposed between the top and bottom surface, the bottom surface adapted to be mounted to a first substrate; a cavity located within the body and in communication with an opening in the bottom surface, the cavity having a height dimension less than a distance between the top and bottom surfaces, the cavity adapted to fit over an antenna structure coupled to the first substrate, the cavity configured to allow a radiation pattern emitted by the antenna structure to traverse therethrough.

In another aspect, a method for manufacturing an antenna package, the method comprising: selecting a first substrate having a first surface and a second surface; coupling a second substrate onto the first surface of the first substrate, the second substrate being made of a dielectric material, wherein the second substrate is in electrical communication with the first substrate; disposing an antenna on the second substrate; coupling a communication device onto the second substrate, wherein the communication device is electrically coupled to the antenna; attaching a lid to the first substrate to encapsulate the antenna and the communication device therein, the lid having a cavity configured to allow radiation from the antenna to be emitted through the lid.

In one or more of the aspects above, the antenna may be a di-patch or other type of antenna. In an embodiment, the second substrate is comprised of quartz, glass, or other dielectric material. In an embodiment, the lens of the lid is a radiation lens positioned above the antenna, whereby the lid further comprises a shoulder portion configured to be in contact with the communication device, the shoulder portion configured to transfer heat from the communication device. In an embodiment, the package includes a plurality of antennas positioned horizontally or vertically adjacent to one another on the second substrate, wherein at least two antennas are spaced apart a one-half wavelength. It is preferred that the communication device comprises a connecting terminal located between a bottom surface of the communicating device and the second substrate, wherein the antenna and the connecting terminal is substantially on the same plane.

In an embodiment, the antenna is a full-wave di-patch antenna and includes a common differential feed point having a positive terminal and a negative terminal coupled to the communication device; a differential feed line pair comprising a first feed line having a distal end coupled to the positive terminal and a second feed line having a distal end coupled to the negative terminal, wherein the first and second feed lines are adjacent to one another at the distal end; a first patch antenna connected to a proximal end of the first feed line; a second patch antenna connected to a proximal end of the second feed line, the first patch antenna and the second patch antenna are spaced a full guide wavelength apart, wherein the first and second patch antennas are configured to maximize energy transfer efficiency therebetween to operate as a single full-wave structure. In an embodiment, the current and voltage delivered to the feed points of the first and second patch antennas are 180 degrees out of phase with respect to one another individually and in phase with one another with respect to the antennas. In an embodiment, a sensor is electrically coupled to the communication device, wherein the sensor is configured to monitor heat produced by the communication device.

BRIEF DESCRIPTION OF THE DRAWINGS

The accompanying drawings, which are incorporated into and constitute a part of this specification, illustrate one or more exemplary embodiments of the present invention and, together with the detailed description, serve to explain the principles and exemplary implementations of the invention.

In the drawings:

FIG. 8 illustrates a diagram of a full-wave di-patch antenna attached to a dielectric substrate and a ground plane according to an embodiment;

FIG. 9 illustrates a cross section view of the schematic of FIG. 8 according to an embodiment.

DESCRIPTION OF EXAMPLE EMBODIMENTS

Figure 1A:
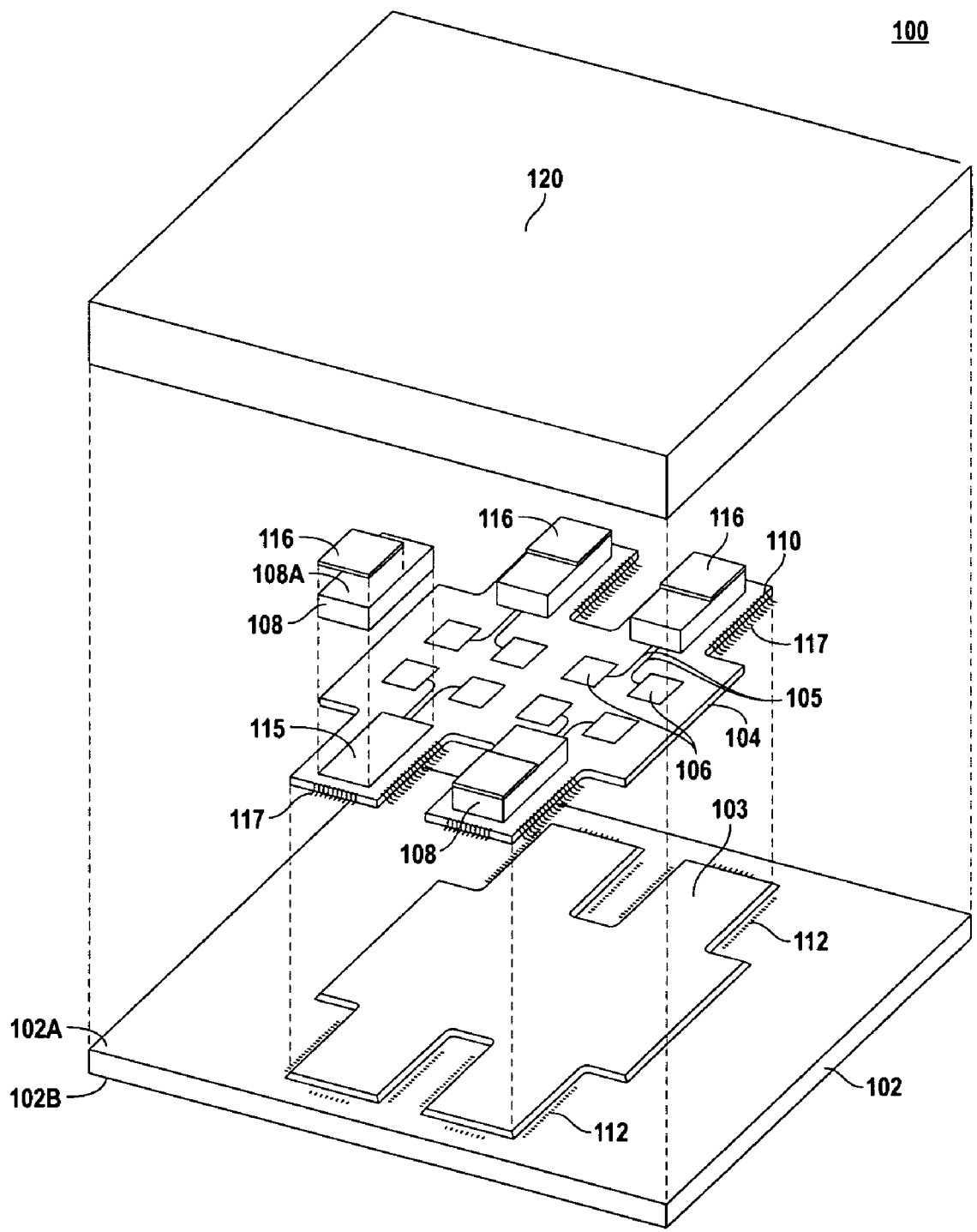
FIG. 1A illustrates an exploded view of the antenna package in accordance with an embodiment.

Various example embodiments are described herein in the context of an integrated antenna chip package. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to exemplary implementations of the present invention as illustrated in the accompanying drawings. The same reference indicators will be used throughout the drawings and the following detailed descriptions to refer to the same or like parts.

In the interest of clarity, not all of the routine features of the exemplary implementations described herein are shown and described. It will of course, be appreciated that in the development of any such actual implementation, numerous implementation-specific decisions must be made in order to achieve the specific goals of the developer, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In general, the following is directed to an integrated chip and antenna package which is designed to be oriented as a substantially flat package and based on existing inter-connect standards such as land grid array (LGA), ball grid array (BGA) or other known package designs. This allows the antenna package to be amenable to high volume manufacturing techniques using standard surface mount production techniques such as pick-in-place and thermal profile soldering. The package is configured such that no separate mechanical antenna assemblies are required, thereby making the package inexpensive and available to high volume production. Sophisticated beam steering technology is also able to be afforded to the implementation of simple surface mount packages with complete active phase array antenna systems.

In an embodiment, the package is of standard size, such as 19 mm×19 mm with 289 pin, 1 mm pitch, ball standard BGA 17×17 grid. In another embodiment, the package is a 19 mm×19 mm with 324 pin, 1 mm pitch, ball BGA 18×18 grid. In an embodiment, the package is a 10 mm×10 mm with 81 pin, 1 mm pitch, ball standard BGA 9×9 grid. However, the size of the package is dependent on the number of antennas and communication devices which are used in the package; thus other sized packages are contemplated. In an embodiment, the package utilizes 60 GHz millimeter wave antennas and enabled communication devices, although not limited thereto. As described below, an embodiment of the inventive subject matter will be discussed in relation to multiple sets of di-patch antennas, whereby each set is coupled to a respective communication device. In an embodiment, different types of antennas and communication devices may be used in a single package. In an embodiment, it is contemplated that multiple transmitter and/or receiver antennas are used in a single package. As discussed below, an embodiment utilizes a package having a single transmitter and/or receiver antenna along with one or more communication devices.

FIG. 1A illustrates an exploded view of the antenna package design in accordance with an embodiment. As shown in FIG. 1A, the package includes a main substrate 102, a secondary substrate 104, and a lid 120. The main substrate in an embodiment is made of a typical printed circuit board material and has a top surface 102A as well as a bottom surface 102B. The main substrate 102 is shown to have a square shape in FIG. 1A although the substrate 102 may have any other desired shape. The bottom surface 102B is configured to support a BGA (e.g. grid of ball interconnects) to allow the main substrate 102 to be electrically coupled to another circuit board or a motherboard (not shown). The combination of the main substrate 102, antenna array on the secondary substrate 104 and lid 120 provide for a compact integrated antenna and chip package which has a standardized size and interconnection configuration to allow the package to be used on existing circuit boards without additional tooling or redesign.

In an embodiment, the top surface 102A of the main substrate 102 shown in FIG. 1A includes a seating portion 103 having a shape configured to receive the secondary substrate 104 thereon. In the embodiment in FIG. 1A, a "H-shaped" secondary substrate 104 is used to attach to the main substrate 102 by an compound although other standard techniques are contemplated to attach the two substrates together. In an embodiment, the second substrate 104 is another shape instead of having the H-shape, whereby the seating portion 103 complements the shape of the second substrate 104 and allows the substrate 104 to be mounted thereto using any appropriate known technology. In an embodiment, the main substrate 102 is made of the same material as the secondary substrate 104, whereby the package does not require two separate substrates to be mounted on one another.

As shown in FIG. 1A, the secondary substrate 104 includes one or more seating areas 115 each of which is adapted to receive a communication device 108 thereon. In particular, four seating areas form part of the secondary substrate 104 to form the "H-shaped" configuration. Each communication device 108 is electrically coupled to one or more respective antennas 106, whereby the antenna 106 and the connecting terminals of the communication device 108 are substantially on the same plane. It should be noted that although four communication devices 108 are shown to be used in the chip package in FIG. 1A, any number of communication devices, including only one, can be used in the chip package 100 based on the desired application.

The communication device operates as a radio and provides power to as well as controls the magnitude and phase of radiation emitted from the antenna. The communication device may be configured to operate as a transmitter, receiver or transceiver. In an embodiment, the communication device is a silicon germanium (SiGe) chip although gallium arsenide (GaAs); complimentary metal oxide semiconductor (CMOS); or other semiconductor chips are contemplated. The details of the workings of the communication device are known in the art and are not discussed herein.

In addition to the seating areas 115, the secondary substrate 104 includes a common area upon which the one or more antennas 106 are located. However it is contemplated that any other shape may be used in manufacturing and using the secondary substrate 104 without departing from the inventive embodiments described herein. In an embodiment, the secondary substrate 104 is made of a dielectric material such as quartz, sapphire, diamond and/or glass to allow the antenna assembly to operate properly. The secondary substrate 104 may be made of any other appropriate low-loss material which allows high radiation efficiencies from the antennas and other components operating in the millimeter wave frequency range.

As shown in FIG. 1A, the antennas 106 are di-patch differential feed antennas which converge together via their feed lines 105 at a common feed point as is described in more detail below. However, it is contemplated that any other type of antenna may be used such as a micro-strip dipole antenna, a regular patch antenna or the like may be used without departing from the inventive embodiments herein.

Figure 1B:
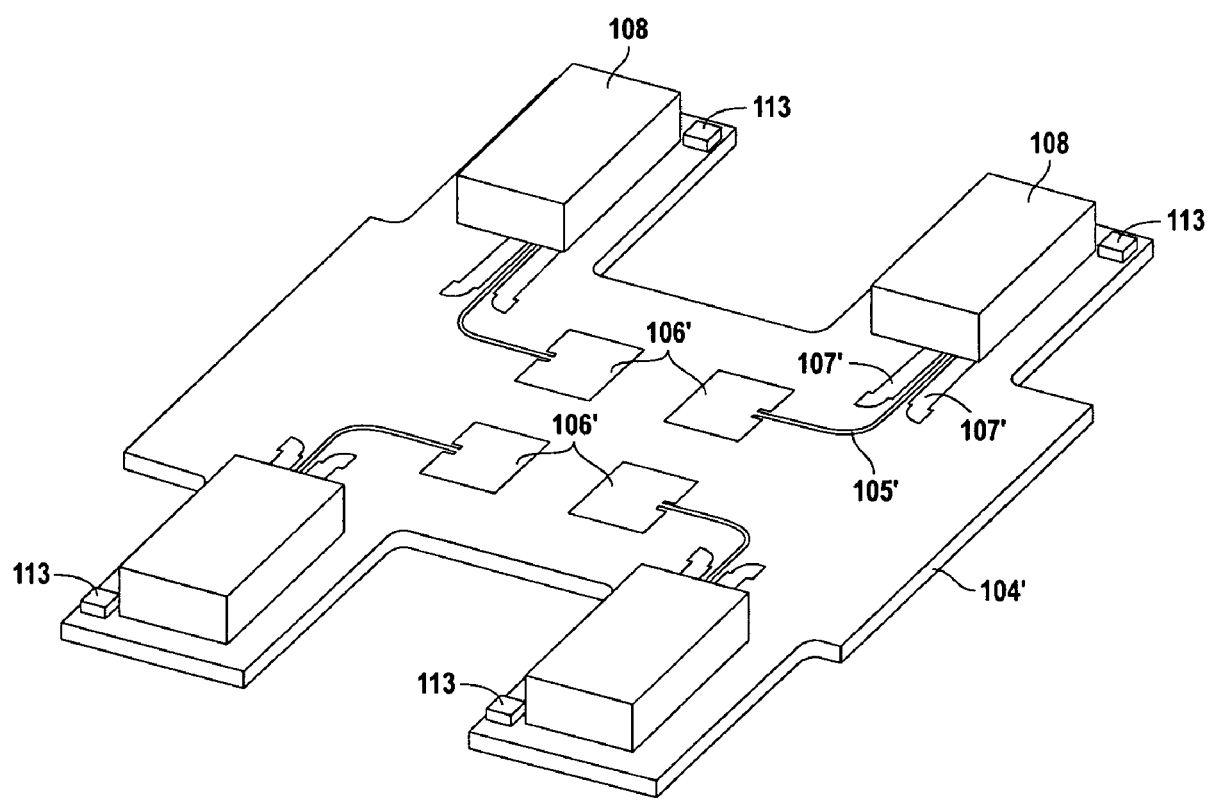
FIG. 1B illustrates a perspective view of an antenna array in accordance with an embodiment.
Figure 1C:
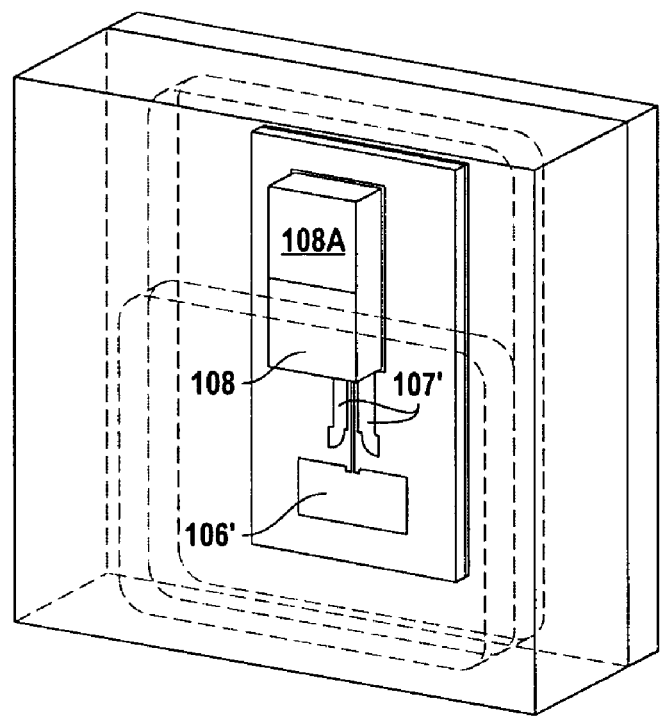
FIG. 1C illustrates a perspective view of a single antenna package in accordance with an embodiment.
Figure 1D:
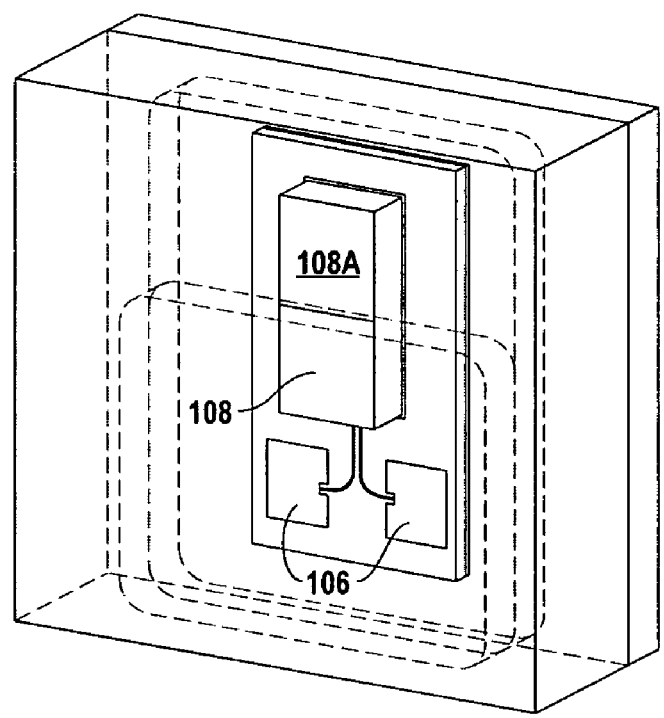
FIG. 1D illustrates a perspective view of a single antenna package in accordance with an embodiment.
Figure 1E:
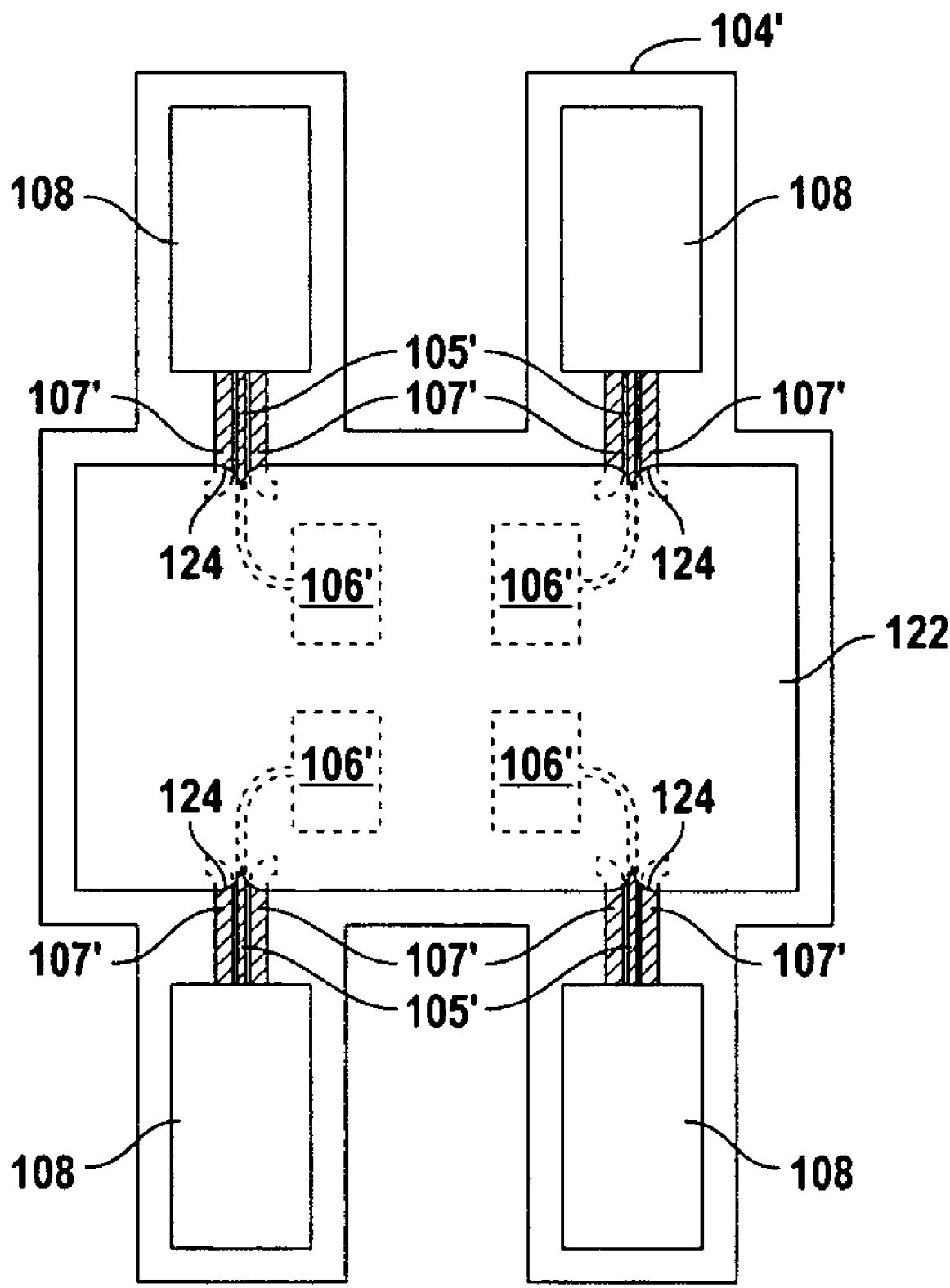
FIG. 1E illustrates a bottom view of the single antenna package in accordance with an embodiment.

In an embodiment shown in FIG. 1B, the secondary substrate 104' includes one or more single feed patch antennas 106' which are electrically coupled to the communication devices 108. The single feed patch antenna 106' is preferably used in applications where the antenna 106' receives wireless communication signals. As shown in FIG. 1B, each patch antenna 106' is electrically connected to its respective feed-line 105' at one end, whereby the feed-line 105' electrically connected at an opposite end to the communication device 108. In addition, each antenna 106' preferably includes a finite ground plane 107' located on opposing sides of the feed line 105' to compensate for the unbalanced feed between the communication device 108 and the antenna 106'. To ensure proper operation of the single patch antenna 106' over the substrate 104', a ground plane 122 is deposited on the bottom surface of the secondary substrate 104', opposite of the top surface of the secondary substrate 104'. FIG. 1E illustrates the bottom surface of the secondary substrate 104' in accordance with an embodiment, whereby the ground plane 122 is positioned such that it is vertically under the patch antennas 106' as well as the feed lines 105'. As shown in FIG. 1E, the ground plane 122 includes a plurality of curved cut outs 124 along the edge of the ground plane 122 on the bottom surface of the substrate 104'. The curved cut outs 124 are located at areas where the coplanar waveguide structures transition to a micro-strip transmission line on the top surface of the substrate 104'. In other words, the ground plane 122 is configured such that it does not substantially overlap the co-planar waveguide structure located above it on the other side of the substrate 104'. The use of ground planes with co-planar wave guide structures in single-patch antenna applications are well known and are not discussed in detail herein.

As stated above, the antenna sets 106' in FIG. 1B are preferably used in receiver applications whereas the di-patch antennas 106 in FIG. 1A are preferably used in transmitter applications, although not necessarily. It is contemplated that the package 100 may comprise one or more sets of transmitter antennas (FIG. 1A) and/or one or more sets of receiver antennas (FIG. 1B) on the secondary substrate 104. In an embodiment, the package shown with lid in FIG. 1C comprises a single patch antenna coupled to the communication device. FIG. 1D illustrates another embodiment in which the package includes a single di-patch antenna coupled to the communication device.

The antennas 106 are disposed on the secondary substrate 104 by a metallization process in an embodiment, although any other appropriate techniques or manufacturing process are contemplated. In an embodiment, the antenna and transmission lines are formed onto a substrate by depositing metal onto the substrate using a thin-film process, whereby various methods of thin film metal deposition may be used. In an embodiment, metal is deposited onto the substrate via chemical vapor deposition, sputtering or plating. In an embodiment, a 3 micrometer layer of gold is deposited over a thin layer of chromium (e.g. 50 nanometers) or titanium on the substrate having a thickness of 250 micrometers to form the patch antennas. Other thicknesses and/or materials may be used and are dependent upon operating frequency and physical packaging constraints for a given application and are not limited to the above values and measurements.

The spacing of an antenna set 106 adjacent to one another on the substrate 104 is designed to create a phased array radiation pattern when activated and controlled by the communication devices 108. By controlling the phase reference signals to each communication device 108 in the package, the package allows coherent radiated energy produced by the antennas 106 to propagate through a radiation lens in the lid 120 or through the main substrate 102, as discussed in more detail below. In addition, although the antenna array is shown as having multiple antenna sets adjacent to one another on the substrate plane 104, two or more sets of antennas may be disposed on top of one another in vertical dimensions along with their respective communication device chips 108 to increase antenna gain and power specifications of the package.

Figure 2:
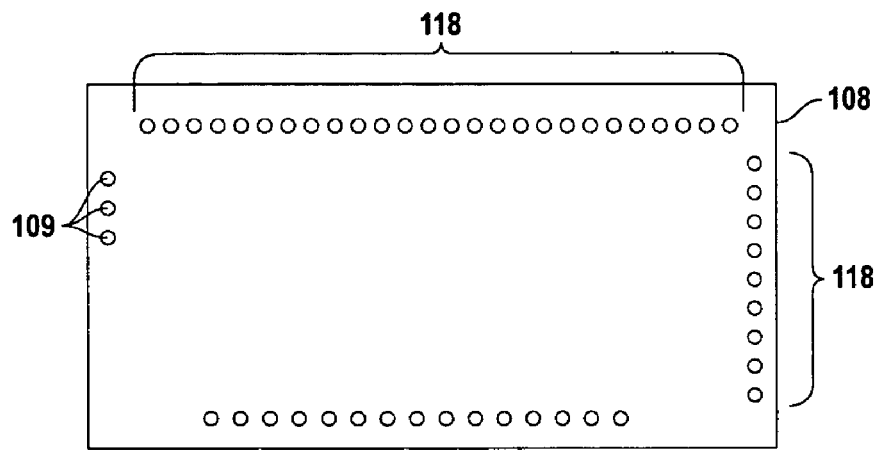
FIG. 2 illustrates a bottom view of a communication device in accordance with an embodiment.

FIG. 2 illustrates a view of the bottom of the communication device 108 in accordance with an embodiment. As shown in FIG. 2, the bottom surface of the communication device 108 includes a series of stud bumps 118 which provide electrical connection between the communication device 108 and the substrate. Of these stud bumps, a plurality of stud bumps 109 are specifically for use with the antenna 106 and are described hereinafter as antenna stud bumps 109. In particular, the antenna stud bumps 109 allow electrical connection and provide exchange of signals with the antenna 106 disposed on the secondary substrate 104. In an embodiment, the antenna stud bumps 109 of the communication device 108 are electrically coupled to the common feed points of the antenna 106.

Referring to FIGS. 1A and 2, each communication device 108 is electrically coupled to its respective antenna 106, whereby the antenna 106 along with its connection feed points and the antenna stud bumps 109 of the communication device 108 are substantially in the same plane. In particular, the communication devices 108 are electrically coupled to the secondary substrate 104 by a flip chip bonding technique, whereby the stud bumps 118 are directly attached to receiving pads on the seating area 115 of the secondary substrate 104. By flip chip bonding the communication device 108 to the secondary substrate 104, the stud bumps 118 (FIG. 2) on the bottom surface of the communication device 108 physically contact the bump pads located on the secondary substrate 104 to establish high frequency and low-loss connections that enable high frequency transmissions with minimal parasitic inductance and capacitance between the communication devices 108 and the secondary substrate 104. In addition, the flip chip bonding technique ensures that the antenna stud bumps 109 are in physical and electrical connection with the connection feed points of the antenna 106. This results in high efficiency, low loss transfer of signals between the antenna 106 and the communication device 108. It should be noted that other appropriate bonding techniques may be used to connect the communication device to the antenna 106 and the main substrate 102.

As shown in FIG. 1A, the secondary substrate 104 also includes several wire bond pads 110 adjacent to the seating area 115 which provide electrical connection between the main and secondary substrates 102, 104, in an embodiment. The wire bond pads 110 are preferably electrically coupled to the stud bump receiving pads via the secondary substrate 104 using conductive traces. In addition, the wire bond pads 110 on the secondary substrate 104 are wire bonded 117 to corresponding pads 112 disposed on the main substrate 102. The wire bonds 117 allow low frequency signals to pass between the communication device 108 and the main substrate 102, as opposed to the high frequency signals between the antenna 106 and communication device 108. It should be noted that other interconnect technologies besides wire bonding, including flip chip, may be used between the secondary and the main substrates to provide connection therebetween.

Figure 3A:
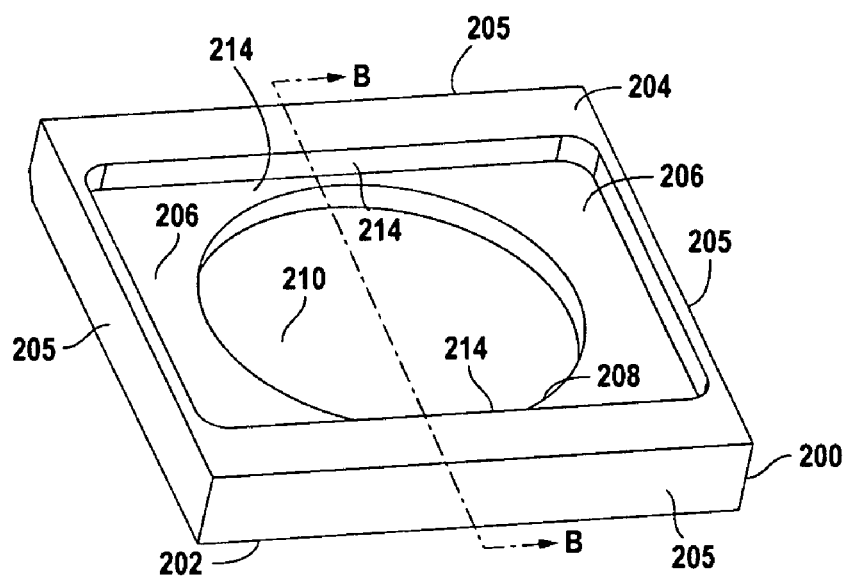
FIG. 3A illustrates a perspective view of a lid for use with the antenna package in accordance with an embodiment.

FIG. 3A illustrates a perspective view of the lid which is used in the antenna package in accordance with an embodiment. In particular for FIG. 3A, the lid 200 is shown upside down to illustrate the interior of the lid 120. The lid 200 includes a top surface 202, a bottom surface 204 and four sides positioned between the top and bottom surfaces. The bottom surface 204 is configured to be in contact with the main substrate 102 when the lid 200 is mounted to the main substrate 102 as shown in FIG. 4, whereby the lid 200 encapsulates the antenna(s), substrate(s), and the communication device(s).

Figure 3B:
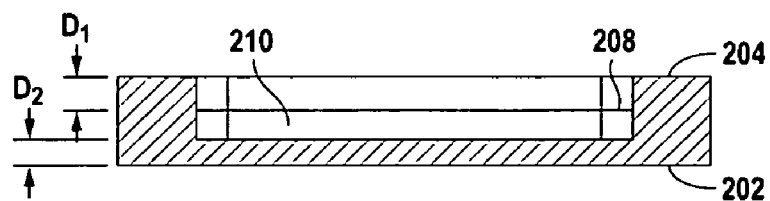
FIG. 3B illustrates a cross sectional view of the lid in FIG. 3A along line B-B.

In an embodiment, the lid 200 shown in FIG. 3A has a two tiered cutout therein, thereby forming a shoulder area 206 and a radiation lens area 210. The shoulder area 206 is located proximal to the bottom 204 and is recessed a distance D1 from the bottom surface 204 as shown in FIGS. 3A and 3B. In addition, the radiation lens area 210 is proximal to the top surface 202 of the lid 200 and is located a distance D2 from the top surface 202 of the lid as shown in FIG. 3B. The distance D2 and thus the thickness of the radiation lens 210 is dependent on the material and dielectric properties of the lid 200 as well as the guide wavelength ($\lambda_g/2$) of the operating frequency of the device.

In an embodiment, the lid 200 is made of aluminum nitride although other low-loss and thermally conductive materials are contemplated. For instance, the lids described herein may be made of high density carbon (e.g. diamond), ceramics, and/or thermoplastic. In the embodiment in which the lid 200 is made of aluminum nitride, the depth D2 is optimized to be approximately one-half of the guide wavelength ($\lambda_g/2$). This causes the radiation lens 210 to be effectively transparent with respect to the radiation generated from the antennas 106 to allow maximum energy to be transmitted through the lens 210.

Figure 4:
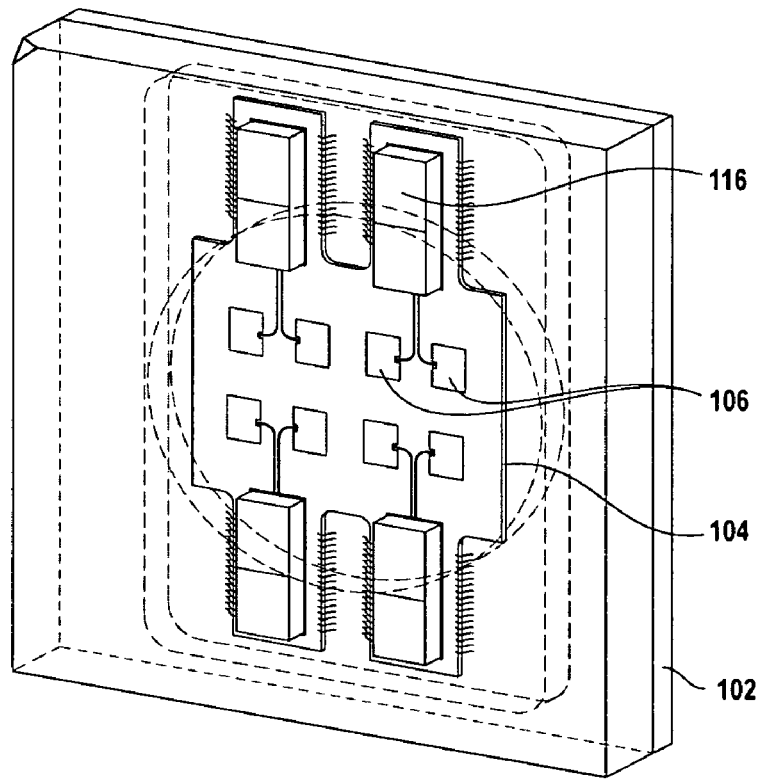
FIG. 4 illustrates a perspective view of the antenna package with attached lid in accordance with an embodiment.

The shoulder area 206 has the height D1 to allow it to be within a predetermined distance from the predetermined contact areas 108A of the communication devices 108 without physically touching the contact areas 108A when the lid 200 is coupled to the main substrate 102 as shown in FIG. 4. In an embodiment, the thermal contact areas 108A of the communication devices 108 have a coating of a thermal compound 116 or other thermally compliant material applied thereon. The compound 116 is thus positioned between the shoulder 206 and the top surface 108A of the communication device 108 when the lid 200 is coupled to the main substrate 102. The thermal compound 116 is thermally conductive and compliant to allow for differential thermal expansion and contraction between all components within the package. The thermal conductivity of the thermal compound 116 allows heat generated from the communication device 108 to be conducted from the communication device 108 to the lid 200 via the compound 116.

In an embodiment, the package 100 includes one or more sensors 113 (FIG. 1B) which are preferably disposed on the secondary substrate 104 and electrically connected to the main substrate 102. The sensors 113 may be used to monitor heat produced by the communication devices 108. In addition, the sensors 113 may be used with another control circuit or the communication device 108 itself to measure operational characteristics of the communication device 108. In particular, a software program coupled to the package may closely monitor the temperature of the communication devices 108 to provide a feedback system. In particular, the feedback system is capable of automatically adjusting the frequency, frequency stability, gain, sweeping and/or other parameters to account for digital monitoring and compensation of parameters upon which the communication device operates in response to the temperature measured in one or more areas of the communication devices 108. In another embodiment, the feedback system is configured so that a user can manually monitor and compensate the system in response to the measured temperature. In an embodiment, a transistor is used as the sensor 113, although any type of sensor may be used. It should be noted that although four sensors 113 are shown (one per communication device), any number of sensors, including only one, may be used in an embodiment. It is contemplated that the sensor 113 may be utilized in any of the embodiments described herein although only shown in the embodiment in FIG. 1B.

Referring back to the embodiment in FIG. 3A, the radiation lens 210 has a circular contour shape 208 and a surface which is substantially planar and parallel to the top surface 202. In an embodiment, the radiation lens 210 is located in the center of the lid and is symmetrical to allow the radiation lens 210 to be positioned over the antennas 106 when the lid 200 is coupled to the main substrate 102, as shown in FIG. 4. As shown in FIGS. 1C and 1D, the lens may be asymmetrical with respect to the lid. The location of the radiation lens 210 allows radiation generated from the antennas 106 to radiate orthogonally with respect to the secondary substrate through the radiation lens 210 with minimal interference and optimal gain. As stated above, the shape and thickness of the radiation lens 210 along with the material of the lid 200 serves to provide optimum conditions for radiation to be emitted from the antennas 106 while allowing a maximum amount of heat to transfer and dissipate from the communication devices 108 to the lid 200.

Figure 3C:
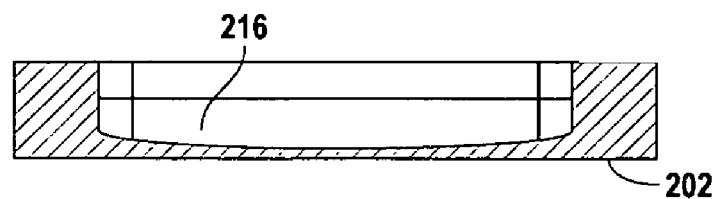
FIG. 3C illustrates a side view of a lid with a curved radiation lens in accordance with an embodiment.
Figure 3D:
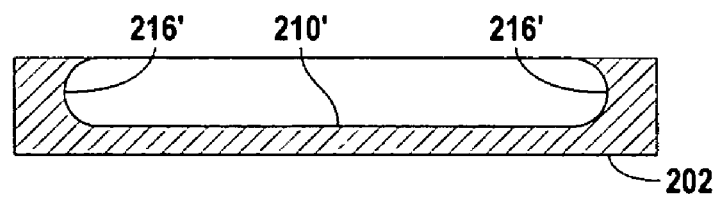
FIG. 3D illustrates a side view of a lid with a curved radiation lens in accordance with an embodiment.

Although the embodiment in FIGS. 3A and 3B illustrates the radiation lens 210 to be substantially flat and parallel to the top surface, it is contemplated that the radiation lens may have a semi-circular, elliptical or other curved design as shown in FIG. 3C. The curved radiation lens 216 shown in FIG. 3C controls the radiation patterns and may produce different radiation patterns due to refraction and diffraction of the energy beams transmitted by the antennas. It should be noted that other designs for the radiation lens are contemplated and are not limited to the designs described herein. For example, as shown in FIG. 3D, the radiation lens 210' is substantially flat and parallel to the top surface of the lid 202. However, the lens 210' has curved sides 216' which may be used to produce a different radiation pattern than the radiation pattern for the lid in FIG. 3B due to refraction and diffraction of the energy beams from the antennas.

Figure 3E:
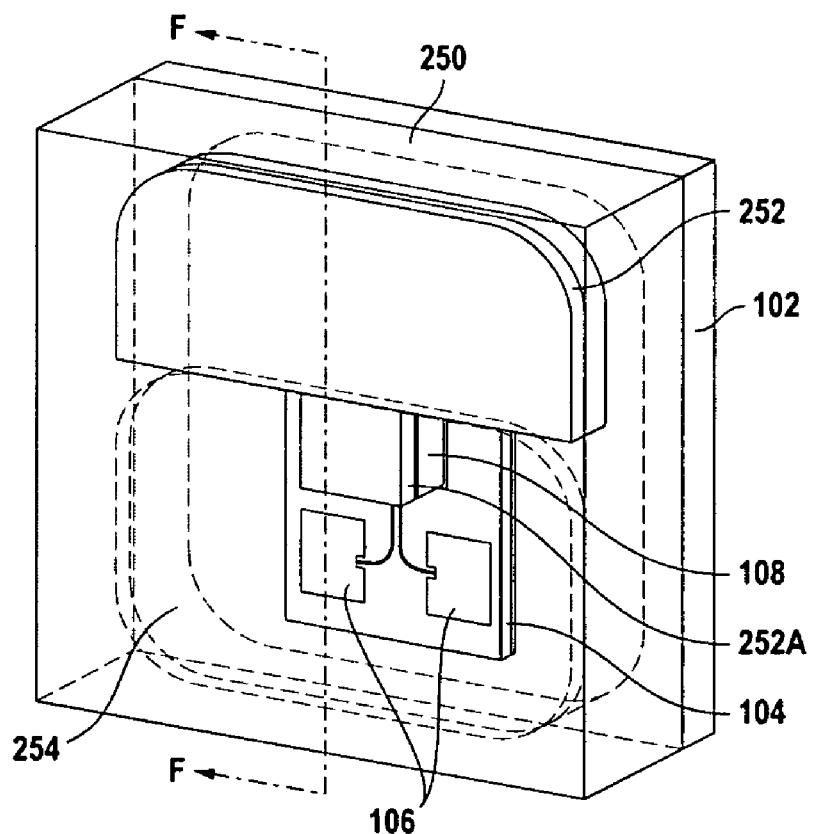
FIG. 3E illustrates a perspective view of a lid for use with the antenna package in accordance with an embodiment.
Figure 3F:
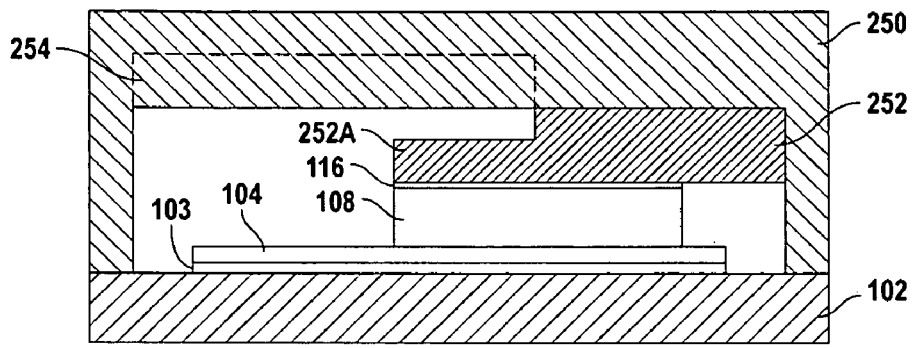
FIG. 3F illustrates a cross sectional view of the lid in FIG. 3E along line F-F.
Figure 3G:
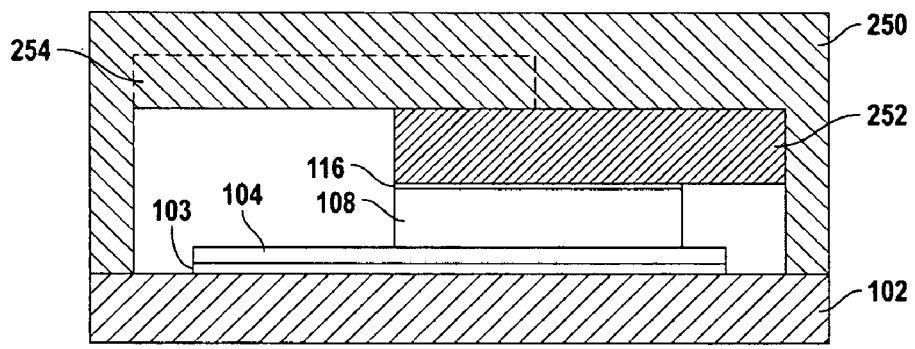
FIG. 3G illustrates a cross sectional view of an alternative of the lid shown in FIG. 3F.

FIGS. 3E and 3F illustrate another embodiment of the lid. As shown in FIG. 3F, the lid 250 includes a radiation lens 254 which positions over the communication device 108 as well as the antenna array 106. In the embodiment shown in FIGS. 3E and 3F, the shoulder portion 252 comprises a thermally conductive insert 252 that is made of a material different than the lid 250 itself. The shoulder insert 252 is positioned within the radiation lens 254 and has a thickness such that it comes within a predetermined distance with the top surface of the communication device 108. As stated above with respect to the other lid embodiments, the shoulder does not come into direct contact with the communication device, but instead contacts a thermal compound which is placed between the communication device 108 and the insert 252. As with the other embodiments, the thermal compound in FIG. 3E allows heat produced from the communication device to conduct therethrough and onto the shoulder insert 252 to be released through the lid 250. In the embodiments in FIG. 3E-3G, the shoulder insert 252 includes a tongue portion 252A which covers the entire top surface of the communication device 108 to allow heat from the communication device 108 to conduct to the shoulder insert 252. The shoulder insert 252 in FIG. 3E has a stepped configuration whereby the tongue portion 252A has a smaller thickness dimension compared to the remaining portion of the insert 252. However, it is contemplated that the tongue portion and the remaining portion (both designated as 252 in FIG. 3G) have the same overall thickness dimension. It is contemplated that lid 250 is made of thermally conductive material with low-loss characteristics including, but not limited to, aluminum nitride, thermoplastics (e.g. Polyphenylene Sulfide), high density carbon (e.g. diamond), and/or ceramics. The shoulder insert 252 is preferably made of copper, although other thermally conductive materials are contemplated.

Figure 5A:
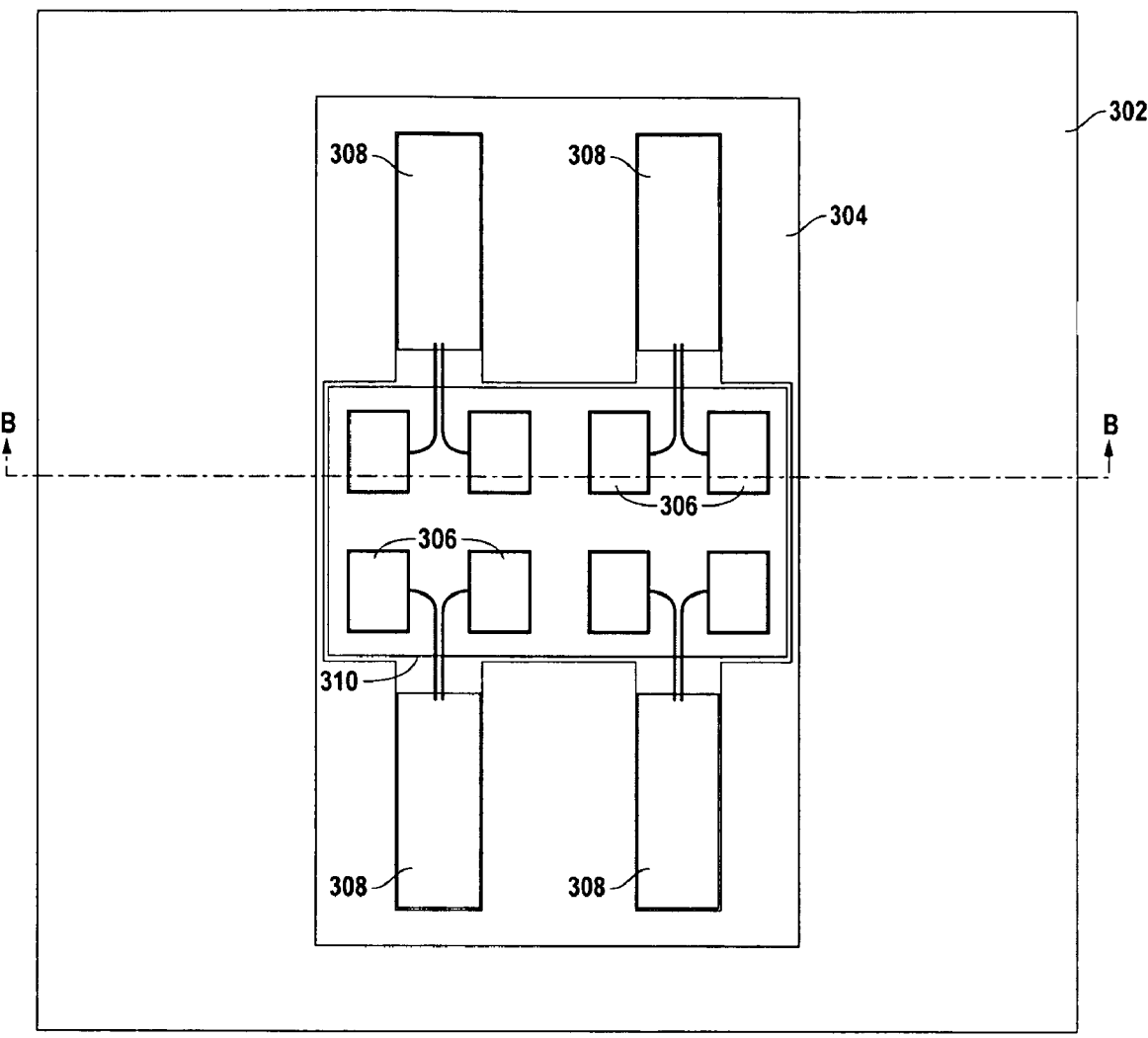
FIG. 5A illustrates a top view of an antenna package in accordance with an embodiment.
Figure 5B:
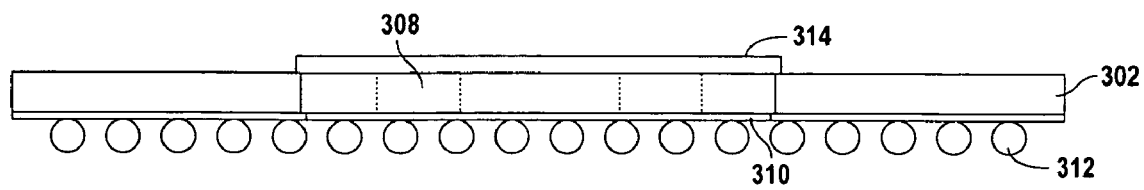
FIG. 5B illustrates a cross sectional view of the package in FIG. 5A along line B-B.
Figure 5C:
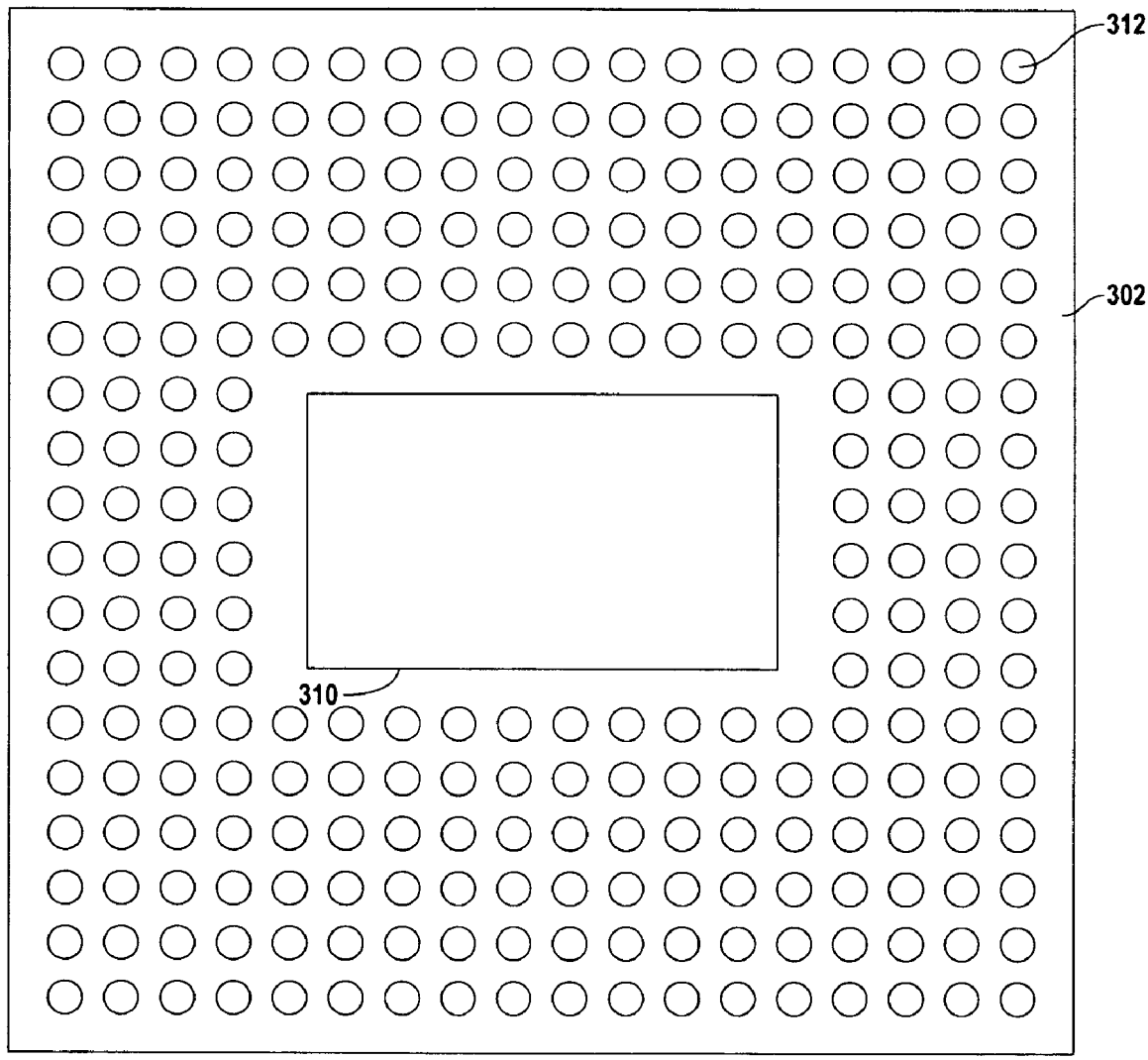
FIG. 5C illustrates a bottom view of the antenna package shown in FIG. 5A.

Although the above embodiments describe the radiation lens being in the lid above the antenna array, the radiation lens may additionally or alternatively be located below the antennas and in the main substrate. FIG. 5A illustrates a top view of a package in which the radiation lens is below the antenna array section. FIG. 5B shows a side view of the same package in accordance with an embodiment. As shown in FIG. 5A the main substrate 302 includes the secondary substrate thereon 304 whereby one or more sets of antennas 306 are disposed on the secondary substrate 304. Again, it should be noted that the embodiment in FIGS. 5A-5C is not limited to di-patch antennas as shown, but can include any other type of antenna. The communication devices 308 are coupled to the antennas 306 to power the antennas 306 as described above. As shown in FIGS. 5B and 5C the main substrate 302 includes one or more radiation lenses 310 positioned between the main substrate 302 and the ball grid array 312. As shown in FIG. 5C, the lens 310 is able to be seen from the bottom of the substrate 302. Alternatively, the radiation lens 310 may be incorporated into the main substrate 302 and/or the secondary substrate 304. In an embodiment, substrate 314 or other dielectric substrate is positioned above the antennas 306 and communication devices 308, whereby the substrate 314 serves as a lid to allow the radiation from the antennas to traverse through. In an embodiment, the lid described above in FIGS. 3A and 3B may be used instead of substrate 314. It should be noted that the designs shown herein are part of an embodiment and other designs are contemplated which fulfill the same or similar functions.

The multiple die transmitters or receivers may be used on one die pad as well as on one main substrate. In an embodiment the package in the main substrate may have secondary substrates 104 on either or both sides whereby instead of a ball grid array being on the opposite surface of the antenna assembly, there is a shared radiating surface between substrates.

Figure 6:
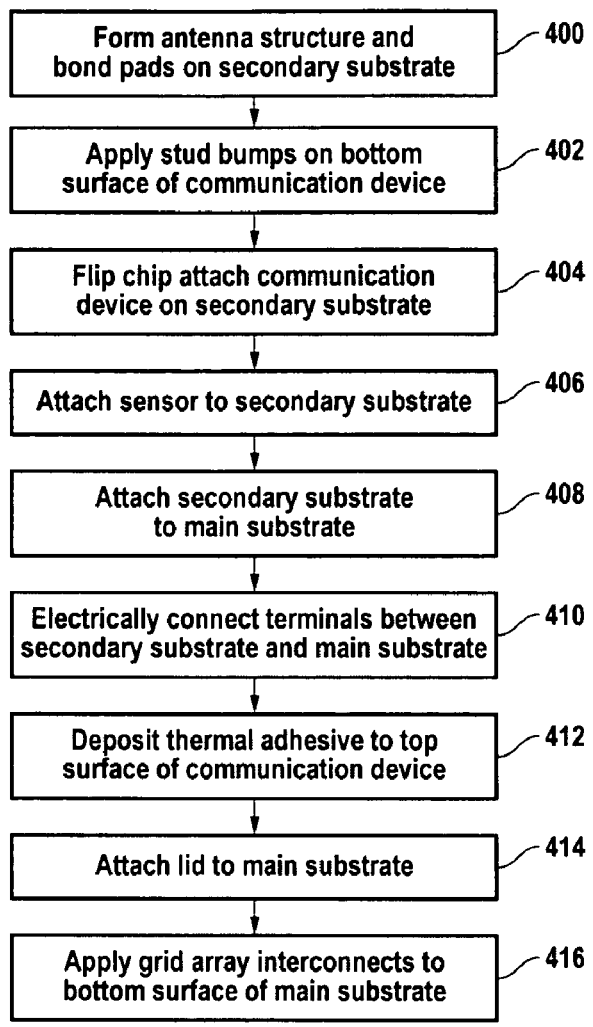
FIG. 6 illustrates a block diagram of a process of manufacturing and forming the integrated chip and antenna package in accordance with an embodiment.

FIG. 6 illustrates a manufacturing process in accordance with an embodiment. It should be noted, however, that the steps discussed herein do not necessarily need to be performed in the particular order described herein. In addition, it should be noted that additional and/or alternative steps which are standard and known in the art, maybe used to manufacture the package described herein.

As shown in FIG. 6, one or more antennas are formed on the secondary substrate in block 400. In addition, the secondary substrate is formed using appropriate known technologies to include all necessary bond pads to allow power and control signals to pass between the antennas, communication devices, main substrate and all other circuit boards which are electrically coupled to the package. The secondary substrate may be formed to have an H shape as shown in the Figures, although other shapes are contemplated. As stated above, the antennas may be metallized, etched or formed using any other appropriate technology onto the secondary substrate. In block 402, the communication device is selected and stud bumps are applied to the bottom surface using appropriate known technologies. In particular, the interconnects are thermally bonded via gold stud bumps to the bottom surface of the communication device. In block 404, the communication device is flip chip attached to the secondary substrate. In attaching the communication devices to the secondary substrate, the communication devices are aligned to ensure a solid electrical connection between the antenna stud bumps and the feed lines of the antenna in the secondary substrate. At this point, the antenna assembly has been formed.

In an embodiment, although not necessary, one or more sensors are attached to the secondary substrate at a designated bond pad directly to the main substrate, as shown in block 406. In an embodiment, underfill is applied between the bottom surface of the communication device and the top surface of the secondary substrate to secure the communication device thereto.

Upon the antenna assembly being formed, the remaining portion of the package is manufactured. In block 408, the secondary substrate is attached to the main substrate using appropriate known technologies. In addition, all electrical connections between the main substrate and the secondary substrate are established by wire bonding, flip chip bonding or other interconnect bonding technologies (block 410). In an embodiment, the main substrate and the secondary substrate are integrally formed as one piece whereby individual substrates do not need to be attached to one another in manufacturing the chip package.

Thereafter, thermal compound is preferably applied to the top surface of the communication devices which will interface and come into contact with the shoulder portion of the lid (block 412). The lid is then attached to the main substrate using appropriate known technologies to form the majority of the package, as in block 414. Grid array interconnects, such as a BGA or LGA are applied to the bottom surface of the main substrate (block 416) to form the package, whereby the package is then able to be attached to a circuit board.

Figure 7:
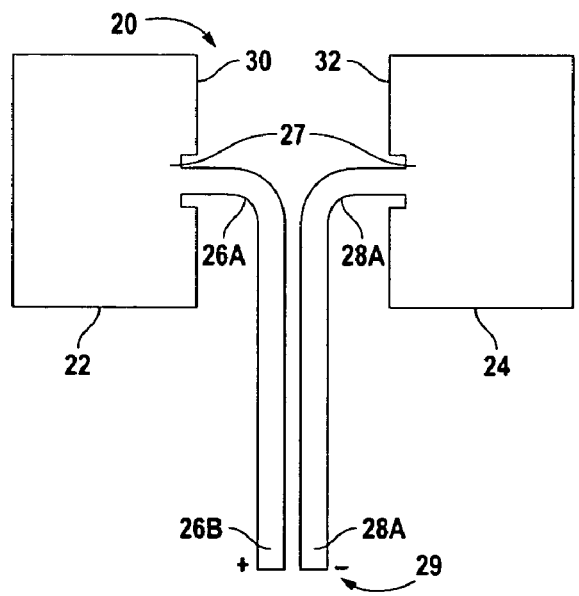
FIG. 7 illustrates a schematic wiring diagram of a full-wave di-patch antenna according to an embodiment.
Figure 10:
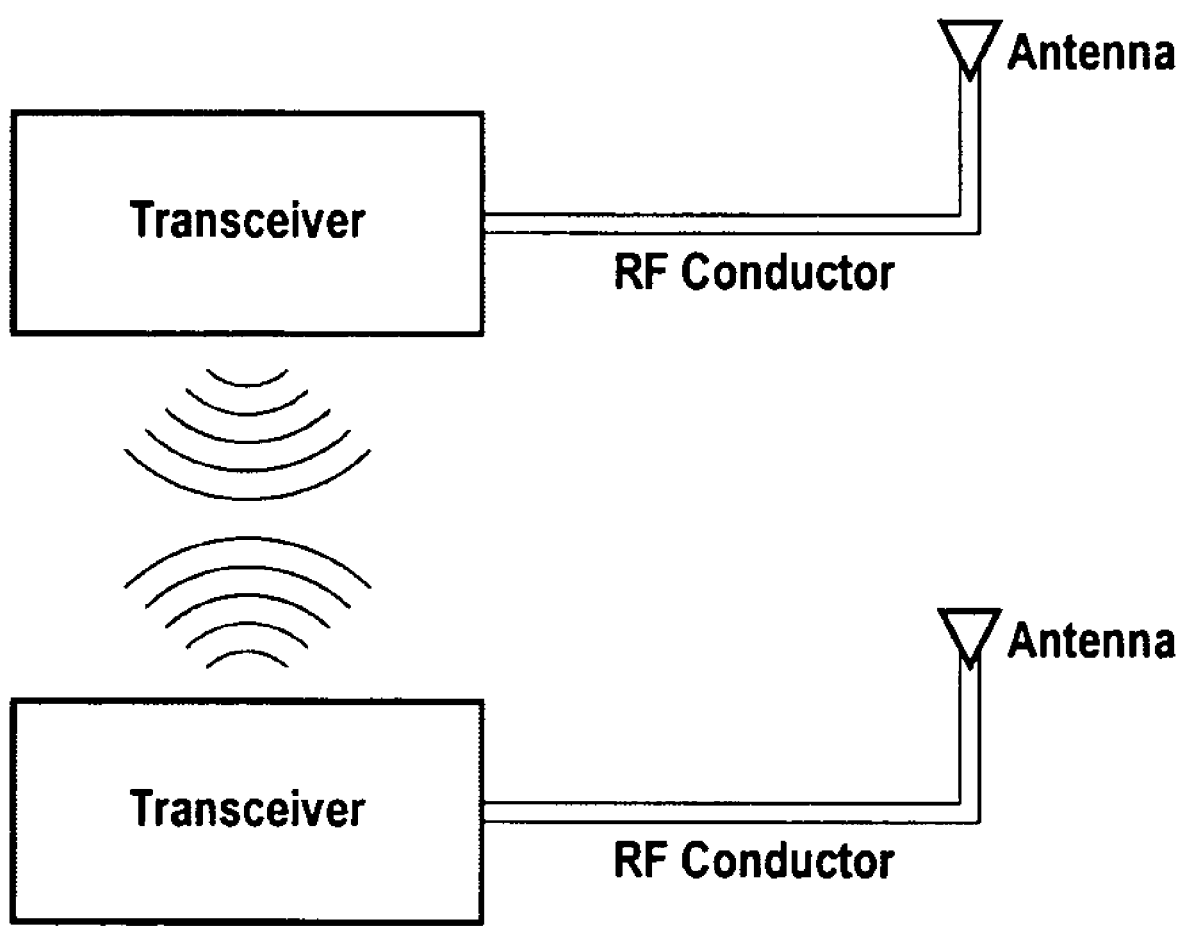
FIG. 10 illustrates a block diagram of a system incorporating the full-wave di-patch antenna according to an embodiment.

As discussed above, in an embodiment, the package includes one or more di-patch antennas disposed on the secondary substrate. Information regarding the di-patch antenna will now be discussed. FIG. 7 illustrates a schematic diagram of a full-wave di-patch antenna according to an embodiment. The efficient antenna operable at millimeter wave frequencies is created on a planar low-loss surface using microstrip techniques. The material for the low-loss surface is comprised of a low-loss dielectric, such as quartz. The antenna and transmission lines is comprised of metal (such as gold or copper) that can be deposited onto the dielectric surface. On the same dielectric surface the transmitter and/or receiver IC can be mounted with the interconnection to the transmission line(s) made through a very small metallic connection (known as a metal bump), with the IC actually facing down (pads facing the deposited metal pads and traces on the dielectric) in a "flipped" position.

In an embodiment, the di-patch antenna 20 shown includes a first patch antenna 22 and a second patch antenna 24. The first and second patch antennas 22, 24 are each coupled to respective feed lines 26, 28. The patch antennas 22, 24 are shown to have a rectangular shape with dimensions (L×W), although the antennas 22, 24 may have any other appropriate shape.

In the case of the rectangular patch shape, the length (L) dimension of the antenna is a critical dimension in which the length dimension L is one-half of the guide wavelength, $\lambda_g$ in an embodiment. The guide wavelength $\lambda_g$ is a half wave length when taking into consideration the dielectric properties of the substrate 32 upon which the patch antenna 20 is disposed as well as other electromagnetic modes that may occur within the dielectric substrate. The $\lambda_g$ is affected by the relative permittivity ($\in_r$) and the thickness of the substrate, and the size of the substrate and groundplane relative to $\lambda$. It is analytically difficult to predict the exact value of L for a particular structure, but very good results are achieved by use of electromagnetic modeling programs. The width (W) dimension is less critical than the length dimension and can be a fraction or multiple of the L dimension. In an embodiment, the patch antennas 22, 24 are square-shaped, whereby the W dimension is equal to length ($\lambda_g/2$). In an embodiment, as shown in FIG. 7, the patch antennas 22, 24 have a rectangular shape wherein the W dimension is one and a half times the length dimension L. The spacing between the two patch antennas 22, 24, center-to-center as shown in FIG. 7, is twice the length dimension (2 L) of the individual patch antennas in an embodiment.

As shown in FIG. 7, two differential or balanced feed lines 26, 28 are coupled to the patch antennas 22, 24. In addition, the first feed line 26 is also coupled to a positive terminal of a differential feed point 29 at a distal end, whereas the second feed line 28 is coupled to a negative terminal of the differential feed point 29 at a distal end. It should be noted that the positive-negative terminals at 29 may be reversed in an embodiment. The feed lines 26, 28 are coupled to the inset feeds 27 at a proximal end, whereby the lines 26, 28 gradually curve at an angle (26A, 28A). The proximal ends of the feed lines 26, 28 are connected to the patch antennas at a center point with respect to the W dimension and are thus rotated ninety degrees relative to the parallel portions 26B, 28B. In an embodiment shown in FIGS. 7 and 8, following the angles at 26A, 28A, the feed lines 26, 28 then become parallel with one another toward their distal ends 26B, 28B. It should be noted that other shapes of the feed lines are contemplated and are not limited to the embodiments only discussed herein.

As shown in FIG. 7, the patch antennas 22, 24 face away from one another and are positioned ninety degrees from and adjacent to the distal portion of the differential feed lines 26B, 28B. In particular, as shown in FIG. 7, the patch antenna 22 is positioned −90° with respect to the distal portion 26B of the differential feed line 26 whereas the patch antenna 24 is positioned +90° with respect to the distal portion 26B of the differential transmission line 28B. In addition, the inset feeds 27 of each antenna 22, 24 are positioned to face one another and are at a closest distance with respect to one another. In contrast, the top edges opposite to the inset feed edges of the antennas 22, 24 are a farthest distance from one another.

The two differential feed lines 26, 28 form a balanced transmission line in which the phase of the current and voltage is inverted 180 degrees between the left and right patch antennas 22, 24 in order to produce in-phase currents and voltages in the left and right patch elements. In other words, the currents in the transmission lines feeding the right and left patch antennas 22, 24 are 180 degrees out of phase with respect to one another, as shown in FIG. 8. However, the currents in the right and left patch antennas 22, 24 are in phase with one another collectively when both antennas 22, 24 are viewed with respect to an external reference. The design incorporates half-wave patch antenna structures in which there is a half-wave gap or $\lambda_g/2$ between the edges 30, 32 of the respective patch antennas 22, 24. This results in a full-wave $\lambda_g$ spacing between the centers of the patch antennas 22, 24 as described above. The radiation pattern phase center is located at the center point between the patch structures as illustrated. By use of the antenna structure shown, the need for a matching balun is eliminated. As a result, maximum energy transfer efficiency is attained. Further, the full-wave di-patch antenna 20 has higher directive gain than a half-wave microstrip patch antenna.

FIG. 8 illustrates a diagram of an assembly of the full-wave di-patch antenna 20 disposed on a dielectric substrate 30 in accordance with an embodiment. FIG. 9 is a cross section view, along the line shown in FIG. 3, of the antenna assembly in FIG. 8. These drawings are not to scale and are only intended to show a general design of the various layers. A wide variety of actual implementations may be possible within the scope of the present invention. Those of ordinary skill in the art will recognize that the dielectric substrate 30 will likely be much thinner than shown. The dielectric substrate 30 is made of a low-loss material such as PTFE based composites, a silicon dioxide ($SiO_2$), quartz, fused silica, ceramic materials, or the like.

As shown in FIG. 8, the angled configuration of the first and second patch antennas 22, 24 allow the currents flowing through both patch antennas 22, 24 to be in phase with one another, as shown by the arrows. In particular to FIG. 8, the current in the first patch antenna 22 flows from left to right, through the feed line 26 to the positive terminal of the feed point, as shown by the arrows. In addition, as shown in FIG. 8, the current travels from the negative terminal at the feed point upward and into the feed line inset in the second patch antenna 24, whereby the current flowing in the patch antenna 24 also travels left to right, as shown by the arrows. This configuration thus results in a single full-wave antenna structure composed of two elements with higher gain than a single patch antenna (approximately 9 dBi for the full-wave antenna compared to 7 dBi of a half wave antenna). In addition, this configuration provides maximum efficiency of the energy transfer to the full-wave antenna 22, 24 without requiring the use of a matching balun.

The antenna configurations described herein employ one or more full wave di-patch antennas, whereby the antenna configurations may be used in several applications. One example application may include millimeter wave transmitters, receivers, or transceivers using a balanced line feed (FIG. 4). Another example application may be a radar transceiver such as those used for vehicular collision avoidance (e.g. 77 GHz) as well as radio frequency identification (RFID), tracking and security systems (e.g. 60 GHz, 92 GHz and/or 120 GHz). Another example may include a passive millimeter wave detection system such as those that may be employed in airport security systems, industrial object tracking, through-the-wall detection systems (24 GHz, 60 GHz, and/or 92 GHz) and the like. A fourth example may be high speed digital communication systems for data links, wireless "no cable" links, high-definition video transport, and/or wireless local area networks using millimeter wave frequencies (60 GHz, 92 GHz, and/or 120 GHz). Those of ordinary skill in the art having the benefit of this disclosure will realize other applications may exist which can utilize the antenna configurations described herein. These configurations are scalable to frequencies up through millimeter and sub-millimeter ranges, including (but not limited to) the "sub terahertz" frequencies from 300 GHz through 1 THz.

Although the antenna configurations are shown and described herein as having two antennas, it is contemplated that more than two antennas may be coupled to a pair of differential feed lines in an embodiment. It is also contemplated that multiple sets of patch antennas may be disposed on a substrate to increase the amount of gain produced and to provide phased array beam steering functionality by controlling the phases of the voltages and currents connected to the feed lines associated with each set of antenna elements.

In operating the package embodiments described above, the package having one or more transmitters, receivers, and/or transceivers within is mounted on a printed circuit board for use with a portable or non-portable electronic device. A power source provides the necessary voltage, current and power to the package via the printed circuit board to operate the communication device as well as the antenna(s) within the package. Logic and/or circuitry is coupled to the package via the printed circuit board to allow operation of the package. During operation, wireless signals carrying information are transmitted at a predetermined frequency, phase and gain from a package having at least one transmitter antenna. The wireless signals are received by another package having at least one receiver antenna. In an embodiment, a processor coupled to the communication device processes the received information. However it is contemplated that the communication device itself may be configured to process the received information.

In an embodiment, a software program running on a computer, processor, ASIC or other module is coupled to one or more printed circuit boards via standard interface bus (e.g. USB), whereby a user may operate one or more packages using the software program and adjust one or more variables including, but not limited to: baseband attenuation, gain, modulation schemes (e.g. FM, AM, QAM), frequency at which the communication device can operate. The range of voltages to operate the package are between and including 1 to 10 volts. The range of current to operate the package is between and including 10-300 mA. The range of power to operate the package is between and including 10-600 mW. It should be noted that these range values are exemplary and it is contemplated that other values for voltage, current and power may be used to operate the package.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. An integrated antenna and chip package comprising:
   a first substrate having a first surface and a second surface, the second surface configured to interface the chip package to a circuit board being made of a first dielectric material;
   a second substrate disposed on the first surface of the first substrate, the second substrate being made of a second dielectric material;
   an antenna disposed on the second substrate;
   a communication device coupled to the antenna, wherein the communication device is disposed on the second substrate;
   a lid coupled to the first substrate and configured to encapsulate the antenna and the communication device, the lid having a lens configured to allow radiation from the antenna to be emitted therethrough; and a sensor electrically coupled to the first substrate and positioned adjacent to the communication device, the sensor configured to measure a temperature of the communication device.

2. The package of claim 1, wherein the second substrate is comprised of quartz.

3. The package of claim 1, wherein the lens is a radiation lens positioned above the antenna, the lid further comprises a shoulder portion configured to be in thermal contact with the communication device, the shoulder portion configured to transfer heat from the communication device.

4. The package of claim 3, wherein the shoulder portion is made of copper.

5. The package of claim 1, wherein the antenna further comprises a plurality of antennas positioned horizontally adjacent to one another on the second substrate, wherein at least two antennas are spaced apart a one-half wavelength.

6. The package of claim 1, wherein the communication device comprises a connecting terminal located between a bottom surface of the communicating device and the second substrate, wherein the antenna and the connecting terminal are substantially on the same plane.

7. The package of claim 1, wherein the antenna is a full-wave di-patch antenna further comprising:
   a common differential feed point having a positive terminal and a negative terminal coupled to the communication device;
   a differential feed line pair comprising a first feed line having a distal end coupled to the positive terminal and a second feed line having a distal end coupled to the negative terminal, wherein the first and second feed lines are adjacent to one another at the distal end;
   a first patch antenna connected to a proximal end of the first feed line;
   a second patch antenna connected to a proximal end of the second feed line, the first patch antenna and the second patch antenna are spaced a full guide wavelength apart, wherein the first and second patch antennas are configured to maximize energy transfer efficiency therebetween to operate as a single full-wave structure.

8. The package of claim 7, wherein the current and voltage delivered to the feed points of the first and second patch antennas are 180 degrees out of phase with respect to one another individually and in phase with one another with respect to the antennas.

9. A method for manufacturing an antenna package, the method comprising:
   selecting a first substrate having a first surface and a second surface;
   coupling a second substrate onto the first surface of the first substrate, the second substrate being made of a dielectric material, wherein the second substrate is in electrical communication with the first substrate;
   disposing an antenna on the second substrate;
   coupling a communication device onto the second substrate, wherein the communication device is electrically coupled to the antenna;
   attaching a lid to the first substrate to encapsulate the antenna and the communication device therein, the lid having a cavity configured to allow radiation from the antenna to be emitted through the lid; and
   coupling a sensor to the communication device, wherein the sensor is configured to measure a temperature of the communication device.

10. The method of claim 9, wherein the antenna is a full wave di-patch antenna.

11. The method of claim 9, wherein the antenna is disposed such that the antenna is in a substantially same plane as a connecting terminal located on a bottom surface of the communicating device.

12. The method of claim 9, wherein the lid comprises a shoulder portion configured to be in thermal contact with the communication device, the shoulder portion configured to transfer heat from the communication device.

13. The method of claim 9, wherein the shoulder portion is made of copper.

* * * * *